(12) United States Patent
Fiebag et al.

(10) Patent No.: US 6,855,487 B2
(45) Date of Patent: Feb. 15, 2005

(54) METHOD AND APPARATUS FOR REFRESHMENT AND REUSE OF LOADED DEVELOPER

(75) Inventors: Ulrich Fiebag, Rosenweg (DE); Hans-Joachim Timpe, Bahnhofstrasse (DE); Uwe Tondock, Langer Hagen (DE); Andreas Vihs, Bachstr (DE)

(73) Assignee: Kodak Polychrome Graphics, LLC, Norwalk, CT (US)

( * ) Notice: Subject to any disclaimer, the term of this patent is extended or adjusted under 35 U.S.C. 154(b) by 265 days.

(21) Appl. No.: 10/044,165

(22) Filed: Oct. 26, 2001

(65) Prior Publication Data
US 2003/0211429 A1 Nov. 13, 2003

(51) Int. Cl.⁷ .................................................. G03F 7/30
(52) U.S. Cl. ....................................................... 430/399
(58) Field of Search ........................................ 430/399

(56) References Cited

U.S. PATENT DOCUMENTS

| | | | |
|---|---|---|---|
| 3,589,261 A | 6/1971 | Krikelis | 396/622 |
| 4,786,417 A | 11/1988 | Miki et al. | 210/639 |
| 4,961,859 A | 10/1990 | Uehara et al. | 210/725 |
| 5,124,736 A | 6/1992 | Yamamoto et al. | 354/325 |
| 5,701,542 A | * 12/1997 | Sasayama | 396/578 |
| 5,811,224 A | 9/1998 | Seeley et al. | |
| 6,153,107 A | 11/2000 | Ogawa et al. | 210/710 |
| 6,247,856 B1 | 6/2001 | Shibano et al. | 396/565 |
| 6,280,527 B1 | * 8/2001 | Sachdev et al. | 134/2 |
| 6,379,558 B1 | * 4/2002 | Ogawa et al. | 210/710 |

FOREIGN PATENT DOCUMENTS

| | | |
|---|---|---|
| DE | 4120075 | 12/1992 |
| EP | 0520793 | 12/1992 |
| EP | 0624828 A1 | 11/1994 |
| EP | 0747773 A1 | 12/1996 |
| EP | 0933684 A1 | 8/1999 |
| EP | 1251403 A1 | 10/2002 |

* cited by examiner

Primary Examiner—Hoa Van Le
(74) Attorney, Agent, or Firm—RatnerPrestia

(57) ABSTRACT

A method and an apparatus for the refreshment and reuse of loaded developers used in lithographic printing are disclosed. The pH of an aqueous, essentially silicate-free loaded developer is reduced to below about 11. Insoluble material is separated, and the pH increased to about 12.0 to 14.0 to produce a refreshed developer. The refreshed developer may be used to develop additional exposed printing plate precursors.

19 Claims, 1 Drawing Sheet

METHOD AND APPARATUS FOR REFRESHMENT AND REUSE OF LOADED DEVELOPER

FIELD OF THE INVENTION

This invention relates to lithographic printing. In particular, this invention relates to a method and to an apparatus for the refreshment and reuse of loaded developers.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, also called printing plate precursors, typically comprise an imageable layer applied over the surface of a hydrophilic substrate. The imageable layer includes one or more radiation-sensitive components, which may be dispersed in a suitable binder. Alternatively, the radiation-sensitive component can also be the binder material.

To obtain a printing plate with imagewise distribution of printable regions, it is necessary to remove regions of an imaged imageable element. The most common method for removing the undesired regions is to contact the imaged element with a developer. If after exposure to radiation the exposed regions of the layer are removed by the developer revealing the underlying hydrophilic surface of the substrate, the element is a positive-working printing element. Conversely, if the unexposed regions are removed, the element is a negative-working element. In each instance, the regions of the imageable layer (i.e., the image areas) that remain after development are ink-receptive, and the regions of the hydrophilic surface revealed by the developing process accept water and aqueous solutions, typically a fountain solution, and repel ink.

Many alkaline-developable positive-working imageable elements comprise an imageable layer comprising a phenolic resin, such as a novolac resin, on a hydrophilic substrate, typically a specially treated aluminum sheet. For example, in one type of element the light sensitive layer comprises a novolac resin and a o-diazoquinone or diazonaphthoquinone, such as a naphthoquinonediazide sulfonic acid ester of a novolac resin. Upon exposure to ultraviolet light, the diazonaphthoquinone is converted to the corresponding carboxylic acid. The developer penetrates and removes the exposed regions of the imageable layer, revealing the underlying hydrophilic surface of the substrate, without substantially affecting the complimentary unexposed regions. During the printing process, the unexposed regions act as the image regions and accept ink.

The imageable layers of certain negative-working printing plates comprise a novolac resin, a cross-linking agent, and a radiation-sensitive component that produces acid on exposure. Subsequent heating cures the exposed regions, so that only the unexposed areas can be removed by an alkaline developer. The exposed regions, which remain after development, are oleophilic and will accept ink.

During the development process, the developer becomes loaded with components of the imageable layer that have been removed during development. Although some of the partly loaded developer is removed from the developing bath with the developed printing plates (drag-out) and is replaced with a replenisher, the amount of material in the developer increases as more printing plate precursors are developed. Once the developer becomes fully loaded, scum will form on the developed printing plates and on the components of the processor. The developer then must be replaced with fresh developer and the loaded developer disposed of.

Because of environmental considerations, the loaded developer must be treated before disposal to render it non-hazardous. If the loaded developer could be reused, it would be unnecessary to dispose of loaded developer and to prepare fresh developer. Thus, a need exists for a method for reusing loaded developer.

SUMMARY OF THE INVENTION

In one aspect, the invention is a method for the reuse of loaded developer. The method comprises the steps of:
  (a) developing an imaged printing plate precursor with an aqueous, essentially silicate-free developer having a pH greater than about 12, and producing a loaded developer comprising loaded solids,
  in which:
    the printing plate precursor comprises an imageable layer over a hydrophilic substrate,
    the imageable layer comprises a polymeric material,
    the polymeric material is either (i) dispersible in an aqueous solution that has a pH of about 12.0 to about 14.0 or (ii) soluble in an aqueous solution that has a pH of about 12.0 to about 14.0 and insoluble in an aqueous solution that has a pH below about 11.0,
    the loaded solids comprise the polymeric material, and
    the loaded developer has a pH of about 12.0 to about 14.0 and a loaded solids content of about 0.1 wt % to about 10 wt %;
  (b) lowering the pH of the loaded developer to below about 11.0 and producing a liquid whose pH is below about 11.0;
  (c) separating insoluble material from the liquid produced in step (b) and producing an essentially colorless liquid, in which the insoluble material comprises material dispersed in the developer, a precipitate formed in step (b), or a combination thereof; and
  (d) raising the pH of the essentially colorless liquid to about 12.0 to about 14.0 and producing a refreshed developer.

The polymeric material is preferably selected from the group consisting of phenolic polymers, carboxylic acid polymers, sulfonamide polymers, and mixtures thereof. The refreshed developer may be used to develop additional imaged printing plate precursors.

In another aspect, the invention is an apparatus for the production of refreshed developer.

BRIEF DESCRIPTION OF THE DRAWING

The invention can be more fully understood from the following description in connection with the accompanying drawing described as follows.

DETAILED DESCRIPTION OF THE INVENTION

Processing

Figure 1:
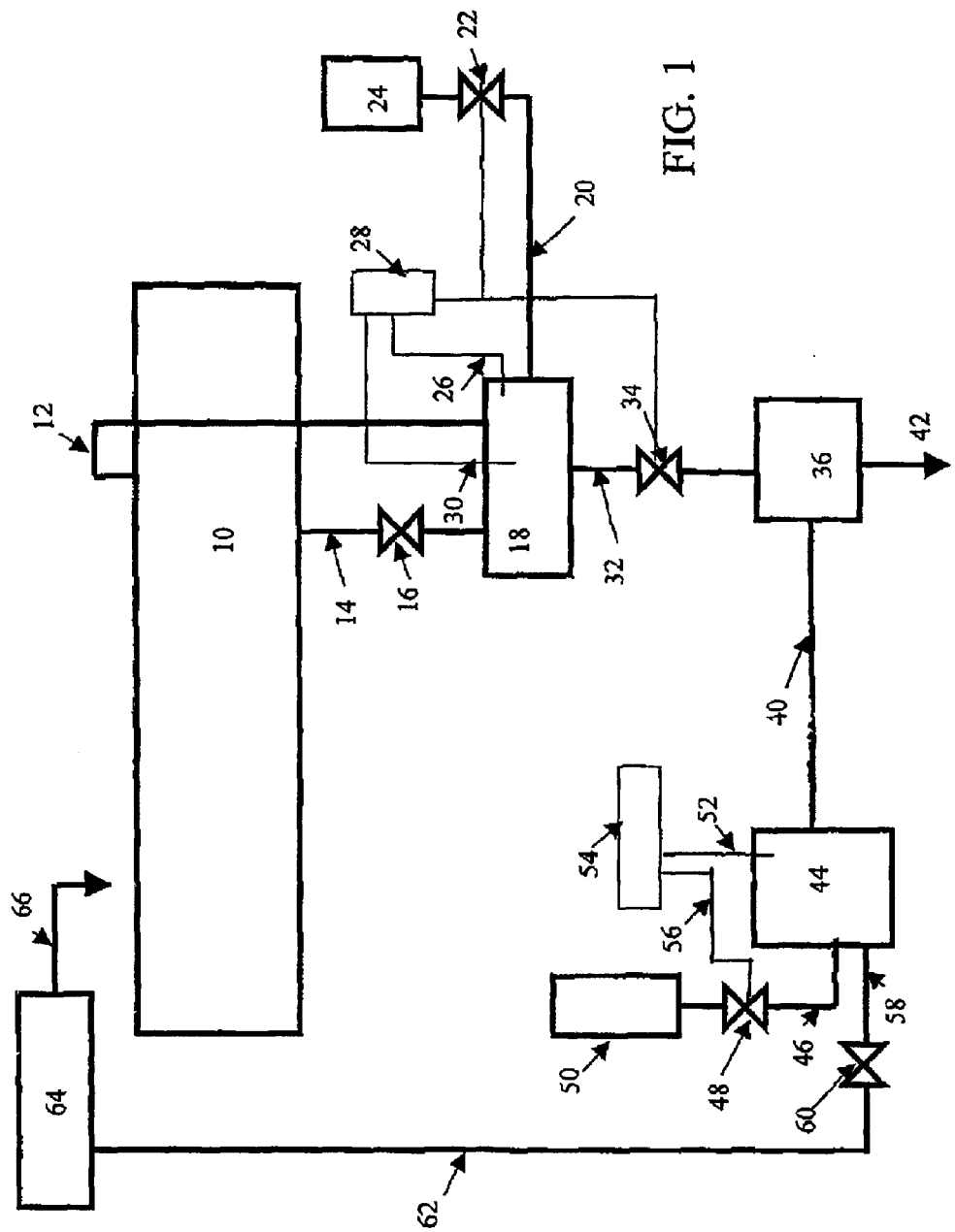
FIG. 1 is a schematic representation of an apparatus for practicing the method of this invention.

In one aspect, the invention is a method for the recovery and reuse of loaded developer. Imaging, as described below, produces an imaged precursor, which comprises a latent image of image regions and non-image regions in the imageable layer. Development of the imaged precursor to form a printing plate, or printing form, converts the latent image to an image by removing the non-image regions, revealing the hydrophilic surface of the underlying substrate.

As described below, the imageable layer of printing plate precursors comprises materials that are soluble or dispersible in aqueous base, such as phenolic polymers, carboxylic acid polymers, and/or sulfonamide polymers. The developers used in the process of the invention have a pH before loading of greater than about 12, typically about 12 to about 14, more typically from about 12.5 to about 13.7. In addition, the developers are essentially free of silicates. Developers that are essentially free of silicates are disclosed, for example, in Nakanishi, U.S. Pat. No. 5,837,425 (EP 0 716 347) and U.S. patent application Ser. No. 09/853,358, filed May 11, 2001.

Typically, the developer is applied to the imaged precursor by rubbing or wiping the imageable layer with an applicator containing the developer. Alternatively, the imaged precursor may be brushed with the developer or the developer may be applied to the precursor by spraying the imageable layer with sufficient force to remove the exposed regions. In either instance, a printing plate is produced.

Development of both positive-working and negative-working imaged precursors is typically carried out at a temperature of from about 18° C. to about 28° C., for a period of from about 5 seconds to about 60 seconds. Development may be carried out in a commercially available processor, such as a Mercury Processor (Kodak Polychrome Graphics) or in the apparatus described below, which is adapted for the method of the invention.

To achieve constant activity for the developer, a replenisher is periodically added to the developer bath so that a balance between developer drag-out and developer feed-in is reached. Because there is a correlation between the electric conductivity and the alkalinity of the developer bath, the activity of the developer can be monitored by conductivity. After a certain number of imaged precursors have been processed, the conductivity value falls below a predetermined level. As soon as a reduction of electrical conductivity is detected, replenisher is added to the section of the processor that contains the developer until the electrical conductivity of the developer reaches its original value. Typically about 30 mL to about 100 mL, more typically about 50–80 mL, of replenisher per 1 $m^2$ of imaged precursor processed is necessary to keep both the alkalinity of the developer and its conductivity value substantially constant.

Alternatively, the alkalinity of the developer can be measured by titration of a developer aliquot with an acid, such as hydrochloric acid. This is necessary for developers whose conductivity cannot be readily measured, such as developers that work with the top-up mode in which the developer is used to replace the alkalinity lost during the developer loading cycle. In these cases, the conductivity changes throughout the developer loading cycle.

During development, the developer becomes loaded with components of the imageable layer that have been removed during development. Although some of the developer is removed with the developed printing plates (drag-out) and is replaced with the replenisher, the developer eventually becomes fully loaded with components of the imageable layer. The loaded developer contains solid material dispersed in the developer and/or material dissolved in the developer. Typically a developer comprises about 0.1 wt % to about 10 wt % of material derived from the printing plate precursors ("loaded solids"), more typically about 4 wt % to about 6 wt % of loaded solids, when fully loaded.

The loaded solids can be removed and developer regenerated for reuse by a process in which the pH is initially lowered. The solids are removed from resulting liquid, whose pH is below about 11.0, by a solid/liquid separation process. Then the pH of the resulting liquid is then increased to produce a refreshed developer.

Typically, the loaded developer has a pH of about 12 to about 14, preferably about 12.5 to about 13.7. The pH of the loaded developer is lowered to below about 11.0, preferably from about 11 to about 7, more preferably from about 11 to about 10. The pH may be lowered by the addition of a strong acid, preferably an aqueous solution of a strong acid, for example hydrochloric acid. The loaded developer is typically stirred during addition of the acid.

After the pH of the developer is reduced, the resulting liquid comprises solid material. The solid material may be developer insoluble material that was dispersed in the developer before its pH was reduced, a precipitate that was formed when the pH was reduced, or a combination thereof. This solid material, including any precipitate formed when the pH of the developer is lowered below about 11, is separated and removed. Any solid/liquid separation process may be used to separate the precipitate, such as, for example, filtration or centrifugation. After the solid is separated a clear, colorless liquid is typically obtained. Essentially all the solids in the developer derived from the printing plate precursors (the loaded solids) are removed by this process.

The pH of the resulting liquid is then increased to about 12 to about 14, preferably about 12.5 to about 13.7, by the addition of base, typically a basic solution containing a strong base, such an aqueous solution of potassium hydroxide. The resulting refreshed developer contains a somewhat higher concentration of a salt, typically potassium chloride, because of the reagents added to bring about the necessary changes. However, the refreshed developer may be used to develop additional imaged printing plate precursors. Or the refreshed developer may be mixed with fresh developer to image additional imaged printing plate precursors.

Following development, the printing plate is rinsed with water and dried. Drying may be conveniently carried out by infrared radiators or with hot air. After drying, the printing plate may be treated with a gumming solution. A gumming solution comprises one or more water-soluble polymers, for example polyvinyl alcohol, polymethacrylic acid, polymethacrylamide, polyhydroxyethyl-methacrylate, polyvinylmethylether, gelatin, and polysaccharide such as dextran, pullulan, cellulose, gum arabic, and alginic acid. A preferred material is gum arabic. A developed and gummed plate may also be baked to increase the run length of the plate. Baking can be carried out, for example at about 220° C. to about 260° C. for about 3 to 10 minutes, or at a temperature of 120° C. for 30 min.

Alternatively, the printing plate precursor may be developed in a combined developing/gumming solution. The combined developer/gumming solution additionally comprises one or more water-soluble polyhydroxy compounds, such as meso-inosit, ribonic acid, gluconic acid, mammonic acid, and gulonic acid glucamine, N-methyl-glucamine, and 1-desoxy-1-(methylamino)-galactit. The polyhydroxy compounds comprise about 10 wt % to about 30 wt % of the developer. In this case, both the rinsing step and the gumming step are omitted from the development process.

Apparatus for the Production of Refreshed Developer

In another aspect, the invention is an apparatus for the production of refreshed developer from loaded developer. The apparatus will be described with reference to the accompanying drawing.

FIG. 1 shows in schematic representation such a apparatus, connected to a source of loaded developer. In the illustrated apparatus, the source is shown as the developing tank 10 of a processor for developing imaged printing plate precursors, without showing any of the other parts of such processor except a developer tank 64 associated therewith. Numerous processors for printing plate precursors are known in the art, and they all include a section in which an imaged printing plate precursor is developed. Associated with such section there is a developer pool. This developer pool is the source of the loaded developer to which the components of the present invention are connected. The pool most often includes a reservoir for used or loaded developer and a separate reservoir for fresh or refreshed developer as well as a provision to add developer replenisher. These components, which take a multiplicity of forms, are well known in the art and therefore not described in detail.

The developer refreshener of this invention includes a first tank 18 connected to the developer tank 10 through an overflow connection, pipe 12. Pipe 14 is connected to a selected point on the developer tank 10, which is below the level of the developer. Pipe 14 is used to remove loaded developer from developer tank 10 if the activity of the developer drops below a predetermined level. This typically happens after about 30 to 40 $m^2$ of exposed precursor have been developed per liter of developer.

A valve 16 may be used to extract a predetermined amount of the loaded developer from tank 10. A controller (not shown in the figure) may be used to control this valve. The controller may be digital or analog, and may be programmed to turn the valve on and off either predetermined intervals, after a predetermined number of printing plates have gone through the processor, or in any other sequence as may be desired. Preferably, a manual override is also provided. Valve 16 is, preferably, a solenoid operated valve. The use of such valves is well known in the art.

First tank 18 serves to collect the loaded developer from tank 10. First tank 18 preferably includes a level sensor 26, which provides an indication of the quantity of loaded developer in the first tank. Such level sensor may provide a continuous level indication similar to the indicators used in the automotive industry to monitor the quantity of fuel in the gas tank of a car, or may be a level sensor that produces a signal when the fluid level reaches a particular preset level in the tank. Both types of sensors are well known in the art and commercially available.

The first tank 18 may also include a pH sensor 30, which provides a measurement related to the pH of the developer in the tank. The pH sensor 30 may be a probe of a standard pH meter or may be simply a pH meter that only measures whether a fluid has a pH value over or under a preselected value.

A controller 28 is provided connected to the sensors in tank 18. Controller 28 may be the same controller used to control valve 16 or may be a different controller. In either case, controller 28 is connected to and controls valve 34, which empties tank 18 into a fluid/solid separator 36 through pipe 32. A number of such fluid/solid separators known in the art, ranging from simple filtration systems where the solids are filtered out by passing the mixture through filters, to more sophisticated systems using centrifuge action to separate the solids from the liquid, and combinations of the two. Again, such equipment is well known in the art. Although the centrifugal type is preferred, such preference is not critical in practicing this invention.

A source of acid 24 is also provided connected through piping 20 and valve 22 to the first tank 18. Controller 28 is also connected and controls valve 22, as well as valve 34.

The liquid output of the fluid/solid separator 36 is directed through piping 40 to pH treatment tank 44. The solids are emptied from the separator 36 through exit 42 the particulars of which will depend on the specific fluid/solid separator used, and which can be automatic to a collection bin for proper disposal, or manual, as by filter removal and disposal.

Treatment tank 44 preferably also includes a liquid level sensor 52, which produces a signal similar to sensor 26 when a preselected quantity of fluid accumulates in the tank 44. The sensor is connected to a controller 54. Controller 54 may be a separate controller or may be integral with controller 28. Current digital technology permits the use of inexpensive CPU chips to provide multiple control functions at low cost and with great versatility, and such controllers which again are well known in the art are preferred for use in the present invention.

Controller 54 is connected and controls valve 48. Valve 48 connects through piping 46 a source 50 of a basic solution that may be used to adjust the pH of the fluid in treatment tank 44.

Optionally the output of treatment tank 44 may be connected to developer tank 64 used by a printing plate processor to supply developer to developing tank 10. In such case a valve 60 and piping 62 may also be used to control and properly direct the treated developer from tank 44 to tank 64.

What has not been illustrated to avoid unduly complicating the figure are driving pumps that may be necessary to transport the developer between tanks. Such transport may use gravity or pumps depending on the particular space availability of the developer for which such recovery unit is intended. Again, fluid transport between tanks is well known technology in the art.

In operation, loaded developer is collected in tank 18 through the overflow 12 and/or by opening valve 16 at predetermined intervals and for predetermined time periods. When a preset level is detected through sensor 26, controller 28 activates (opens) valve 22 to allow acid to flow into tank 18. Tank 18 may contain a stirrer, which is not shown in the figures, to provide adequate mixing of the incoming acid with the loaded developer.

When the pH of the developer in tank 18 detected by sensor 30 reaches a value of less than 11 (or any other desired value) the controller 28 turns valve 22 off stopping further acid addition, and opens valve 34 emptying tank 18 into the fluid/solids separator 36. Typically, addition of acid forms a precipitate in the loaded developer.

The precipitate and any other solid material present in the liquid formed by addition of acid is separated in the fluid/solids separator 36 and collected for proper disposal. The liquid is sent to treatment tank 44. Once sufficient liquid has accumulated in tank 44 sensor 52 provides a signal to controller 54. Controller 54 then actuates valve 48 and directs a predetermined amount of a basic solution into tank 44 sufficient to bring the pH level of the liquid to a desired value and produce a refreshed developer.

Optionally, tank 44 also includes a pH sensor. The amount of basic solution added is controlled using the output of such sensor to stop the flow of the basic solution when a desired value is reached, much as described with respect to the addition of the acid solution in tank 18.

If the recovery unit is attached to or is an integral part of a printing plate processor, the output of the treatment tank 44 following treatment is connected to the developer tank of the processor for re-use of the refreshed developer.

While the illustration of this apparatus shows valves to direct the flow of the developer and additives between tanks, it is understood that pumps may be also be used with or instead of valves as is well known in the art. In such case metering pumps may be used to control the amount of acid or alkaline additive with a high degree of accuracy.

Imageable Elements

The imageable elements used in the process of the invention comprise a substrate comprising a hydrophilic surface and an imageable layer over the hydrophilic surface of the support. The imageable layer comprises a polymeric material, or a mixture of polymeric materials, that is either (a) dispersible in an aqueous solution that has a pH of about 12.0 to about 14.0 or (b) soluble in an aqueous solution that has a pH of about 12.0 to about 14.0 and insoluble in an aqueous solution that has a pH below about 11.0. Other layers, such as an underlayer between the support and the imageable layer, and/or an absorber layer between the imageable layer the support or, if present, the underlayer, may also be present, provided these layers do not comprise polymeric materials that are not either (a) soluble or dispersible in an aqueous solution that has a pH of 12.0 to 14.0 and (b) removable from an aqueous solution that has a pH below about 11.0.

The imageable elements may be "one layer plates," "two layer plates," "three layer plates," etc. If the imageable layer is the only layer present, the plate is a "one layer plate." If an underlayer is present between the imageable or top layer and the substrate, the plate is a "two layer plate." If an absorber layer is also present between the top layer and the underlayer, the plate is a "three layer plate."

There is no limitation on the number of layers that may be present in the imageable element, provided that each of the layers contains polymers and/or other ingredients that are soluble or dispersible in the developer and that are removable from the loaded developer by lowering the pH of the loaded developer followed by removal of insoluble material. The insoluble material may comprise a precipitate formed when the pH of the loaded developer is reduced and/or developer insoluble material that was dispersed in the developer. Elements that comprise a layer of polyvinyl alcohol, for example, cannot be used in the process of the invention. Polyvinyl alcohol is not removed from the loaded developer by lowering the pH of the developer followed by solid/liquid separation.

The hydrophilic substrate, i.e., the substrate that comprises at least one hydrophilic surface, comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof. The surface of the aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 600 $\mu$m. Typically, the substrate comprises an interlayer between the aluminum support and the imageable layer. The interlayer may be formed by treatment of the support with, for example, silicate, dextrine, hexafluorosilicic acid, phosphate/fluoride, polyvinyl phosphonic acid (PVPA), or polyvinyl phosphonic acid copolymers.

Positive-working photoimageable compositions, useful in the imageable or top layer of positive-working printing plate precursors, are well known. They are discussed, for example, in Chapter 5 of *Photoreactive Polymers: the Science and Technology of Resists*, A. Reiser, Wiley, New York, 1989, pp. 178–225. These compositions comprise a first polymeric material, which is a water insoluble alkali soluble binder, as well as a material that comprises a photosensitive moiety. The photosensitive moiety may be bonded to the polymeric material and/or be present in a separate compound.

The first polymeric material may be a light-stable, water-insoluble, aqueous alkaline developer-soluble, film-forming polymeric material that has a multiplicity of phenolic hydroxyl groups, either on the polymer backbone or on pendant groups. Phenolic groups impart aqueous alkaline developer solubility to the imageable layer and also are believed to form a thermally frangible complex with a dissolution inhibitor. Novolac resins, resol resins, acrylic resins that contain pendent phenol groups, and polyvinyl phenol resins are preferred phenolic resins. Novolac resins are more preferred. Novolac resins are commercially available and are well known to those skilled in the art. Other phenolic resins useful as the polymeric material include polyvinyl compounds having phenolic hydroxyl groups. Such compounds include, for example, polyhydroxystyrenes and copolymers containing recurring units of a hydroxystyrene, and polymers and copolymers containing recurring units of substituted hydroxystyrenes. The first polymeric material may also be a water insoluble, base soluble polymeric compound having pendent sulfonamide groups, such as is described in Aoshima, U.S. Pat. No. 5,141,838 (EP 330,239).

The photosensitive moiety is typically the o-diazonaphthoquinone moiety. Compounds that contain the o-diazonaphthoquinone moiety (i.e., quinonediazides), preferably compounds that comprise an o-diazonaphthoquinone moiety attached to a ballasting moiety that has a molecular weight of at least 1500, but less than about 5000, are preferred. Typically, these compounds are prepared by the reaction of a 1,2-naphthoquinone diazide having a halogenosulfonyl group, typically a sulfonylchloride group, at the 4- or 5-position with a mono- or poly-hydroxyphenyl compound, such as mono- or poly-hydroxy benzophenone.

Polymeric diazonaphthoquinone compounds include derivatized resins formed by the reaction of a reactive derivative that contains a diazonaphthoquinone moiety and a polymeric material that contains a suitable reactive group, such as a hydroxyl or amino group. Suitable polymeric materials for forming these derivatized resins include the novolac resins, resole resins, polyvinyl phenols, acrylate and methacrylate copolymers of hydroxy-containing monomers such as hydroxystyrene. Representative reactive derivatives include sulfonic and carboxylic acid, ester, or amide derivatives of the diazonaphthoquinone moiety. Derivatization of phenolic resins with compounds that contain the diazonaphthoquinone moiety is well known in the art and is described, for example, in West, U.S. Pat. Nos. 5,705,308, and 5,705,322.

The positive-working thermally imageable top layer may comprise the first polymeric material and a dissolution inhibitor. Such systems are disclosed in, for example, Parsons, U.S. Pat. No. 6,280,899, incorporated herein by reference; Nagasaka, EP 0 823 327; Miyake, EP 0 909 627; West, WO 98/42507; and Nguyen, WO 99/11458. The polymeric material is typically a phenolic resin, such as a novolac resin.

Useful polar groups for dissolution inhibitors include, for example, diazo groups; diazonium groups; keto groups; sulfonic acid ester groups; phosphate esters groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds containing other polar groups, such as ether, amine, azo, nitro, ferrocenium, sulfoxide, sulfone, and disulfone may also be useful as dissolution inhibitors. Monomeric or polymeric acetals having recurring acetal or ketal groups, monomeric or polymeric ortho carboxylic acid esters having at least one ortho carboxylic acid ester or amide group, enol ethers, N-acyliminocarbonates, cyclic acetals or ketals, β-ketoesters or β-ketoamides may also be useful as dissolution inhibitors. Compounds that contain a positively charged (i.e., quaternized) nitrogen atom useful as dissolution inhibitors include, for example, tetraalkyl ammonium compounds, quinolinium compounds, benzothiazolium compounds, pyridinium compounds, and imidazolium compounds.

A preferred group of dissolution inhibitors are triarylmethane dyes, such as ethyl violet, crystal violet, malachite green, brilliant green, Victoria blue B, Victoria blue R, and Victoria blue BO. These compounds can also act as contrast dyes, which distinguish the unimaged regions from the imaged regions in the developed imageable element.

The dissolution inhibitor may be a compound that comprises an o-diazonaphthoquinone moiety, such as is discussed above. The derivatized resins that comprise an o-diazonaphthoquinone moiety can act as both the polymeric material and the dissolution inhibitor. They can be used alone, or they can be combined with other polymeric materials and/or dissolution inhibitors.

When a dissolution inhibitor is present in the imageable layer, its amount can vary widely, but generally it is at least about 0.1 wt %, typically about 0.5 wt % to about 30 wt %, preferably about 1 wt % to 15 wt %, based on the total dry composition weight of the layer.

An underlayer may be present. When present, the underlayer is between the hydrophilic surface of the hydrophilic substrate and the imageable layer or, if an absorber layer is present, between the hydrophilic surface of the hydrophilic substrate and the absorber layer. After imaging, it is removed in the imaged regions along with the absorber layer, if present, and the imageable layer by the aqueous alkaline developer to expose the underlying hydrophilic surface of the substrate. It is preferably soluble in the aqueous alkaline developer to prevent sludging of the developer.

The underlayer comprises a second polymeric material. The second polymeric material preferably is soluble in an aqueous alkaline developer. In addition, the second polymeric material should be insoluble in the solvent used to coat the imageable layer so that the imageable layer can be coated over the underlayer without dissolving the underlayer.

Polymeric materials useful as the second polymeric material include those that contain an acid and/or phenolic functionality, and mixtures of such materials. Useful polymeric materials include carboxy functional acrylics, vinyl acetate/-crotonate/vinyl neodecanoate copolymers, styrene maleic anhydride copolymers, phenolic resins, maleated wood rosin, and combinations thereof.

Solvent resistant underlayers are disclosed in Shimazu, WO 01/46318. Particularly useful polymeric materials are copolymers that comprise N-substituted maleimides, especially N-phenylmaleimide; polyvinylacetals; methacrylamides, especially methacylamide; and acrylic and/or methacrylic acid, especially methacrylic acid. More preferably, two functional groups are present in the polymeric material, and most preferably, all three functional groups are present in the polymeric material. The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other aqueous alkaline soluble monomers, such as acrylic acid, may be used in place of some or all of the methacrylic acid.

Another group of preferred polymeric materials for the second polymeric material are aqueous alkaline developer soluble copolymers that comprise a monomer that has a urea bond in its side chain (i.e., a pendent urea group), such are disclosed in Ishizuka, U.S. Pat. No. 5,731,127. These copolymers comprise about 10 to 80 wt %, preferably about 20 to 80 wt %, of one of more monomers represented by the general formula:

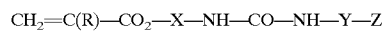

in which R is —H or —CH$_3$; X is a bivalent linking group; Y is a substituted or unsubstituted bivalent aromatic group; and Z is —OH, —COOH, or —SO$_2$NH$_2$.

R is preferably CH$_3$. Preferably X is a substituted or unsubstituted alkylene group, substituted or unsubstituted phenylene [C$_6$H$_4$] group, or substituted or unsubstituted naphthalene [C$_{10}$H$_6$] group; such as —(CH$_2$)$_n$—, in which n is 2 to 8; 1,2-, 1,3-, and 1,4-phenylene; and 1,4-, 2,7-, and 1,8-naphthalene. More preferably X is unsubstituted and even more preferably n is 2 or 3; most preferably X is —(CH$_2$CH$_2$)—. Preferably Y is a substituted or unsubstituted phenylene group or substituted or unsubstituted naphthalene group; such as 1,2-, 1,3-, and 1,4-phenylene; and 1,4-, 2,7-, and 1,8-naphthalene. More preferably Y is unsubstituted, most preferably unsubstituted 1,4-phenylene. Z is —OH, —COOH, or —SO$_2$NH$_2$, preferably —OH. A preferred monomer is:

in which Z is —OH, —COOH, or —SO$_2$NH$_2$, preferably —OH.

In the synthesis of a copolymer, one or more of the urea group containing monomers may be used. The copolymers also comprise 20 to 90 wt % other polymerizable monomers, such as maleimide, acrylic acid, methacrylic acid, acrylic esters, methacrylic esters, acrylonitrile, methacrylonitrile, acrylamides, and methacrylamides. A copolymer that comprises in excess of 60 mol % and not more than 90 mol % of acrylonitrile and/or methacrylonitrile in addition to acrylamide and/or methacrylamide provides superior physical properties. More preferably the alkaline soluble copolymers comprise 30 to 70 wt % urea group containing monomer; 20 to 60 wt % acrylonitrile or methacrylonitrile, preferably acrylonitrile; and 5 to 25 wt % acrylamide or methacryamide, preferably methacrylamide. Synthesis of the aqueous alkaline soluble copolymers that have urea bonds in their side chains is disclosed, for example, in Ishizuka, U.S. Pat. No. 5,731,127.

Other aqueous alkaline developer soluble polymeric materials may be useful in the underlayer. Derivatives of methyl vinyl ether/maleic anhydride copolymers that contain an N-substituted cyclic imide moiety and derivatives of styrene/maleic anhydride copolymers that contain an N-substituted cyclic imide moiety may be useful if they have the required solubility characteristics. These copolymers can be prepared by reaction of the maleic anhydride copolymer with an amine, such as p-aminobenzenesulfonamide, or p-aminophenol, followed by ring closure by acid.

Another group of polymeric materials that are useful in the underlayer include aqueous alkaline developer soluble copolymers that comprise about 10 to 90 mol % of a sulfonamide monomer unit, especially those that comprise N-(p-aminosulfonylphenyl)methacrylamide, N-(m-aminosulfonylphenyl)methacrylamide N-(o-aminosulfonylphenyl)methacrylamide, and/or the corresponding acrylamide. Useful alkaline developer soluble polymeric materials that comprise a pendent sulfonamide group, their method of preparation, and monomers useful for their preparation, are disclosed in Aoshima, U.S. Pat. No. 5,141,838. Particularly useful polymeric materials comprise (1) the sulfonamide monomer unit, especially N-(p-aminosulfonylphenyl)methacrylamide; (2) acrylonitrile and/or methacrylonitrile; and (3) methyl methacrylate and/or methyl acrylate.

Combinations of alkaline developer soluble polymeric materials may be used in the underlayer to provide improved chemical resistance, i.e., resistance to both fountain solution and to aggressive washes. Combination of (1) a copolymer that comprises N-substituted maleimides, especially N-phenylmaleimide; methacrylamides, especially methacrylamide; and acrylic and/or methacrylic acid, especially methacrylic acid with (2) an alkaline soluble copolymer that comprises a urea in its side chain or with an alkaline soluble copolymer that comprises 10 to 90 mol % of a sulfonamide monomer unit, especially one that comprise N-(p-aminosulfonylphenyl)methacrylamide, N-(m-aminosulfonylphenyl)methacrylamide N-(o-aminosulfonylphenyl)methacrylamide, and/or the corresponding acrylamide, is especially advantageous. One or more other polymeric materials, such a phenolic resin, may also be present in the combination. Preferred other polymeric materials, when present, are novolac resins.

If the element is adapted for imaging with infrared radiation, it comprises a photothermal conversion material. Thermally imageable elements are imaged by exposure with infrared radiation and typically absorbs radiation in the range of about 800 nm to 1200 nm, the range of radiation commonly used for imaging thermally imageable elements. An absorber, sometimes referred to as a photothermal conversion material is present in the underlayer, the imageable layer, and/or a separate absorber layer. When an absorber layer is present, it is typically located between the imageable layer and the underlayer.

The photothermal conversion material is preferably located in the underlayer or in a separate absorber layer. The imageable layer is substantially free of photothermal conversion materials, i.e. the imageable layer preferably does not absorb radiation used for imaging, typically radiation in the range of 800 nm to 1200 nm. When an absorber layer is present, it preferably consists essentially of the photothermal conversion material and, optionally, a surfactant. It may be possible to use less of the photothermal conversion material if it is present in a separate absorber layer rather than either the underlayer and/or the imageable layer.

Photothermal conversion materials absorb radiation and convert it to heat. Photothermal conversion materials may absorb ultraviolet, visible, and/or infrared radiation and convert it to heat. Although the first polymeric material may itself comprise an absorbing moiety, i.e., be a photothermal conversion material, typically the photothermal conversion material is a separate compound.

The imaging radiation absorber may be either a dye or pigment, such as a dye or pigment of the squarylium, merocyanine, indolizine, pyrylium, or metal diothiolene class. Examples of absorbing pigments are Projet 900, Projet 860 and Projet 830 (all available from the Zeneca Corporation), and carbon black. Dyes, especially dyes with a high extinction coefficient in the range of 750 nm to 1200 nm, are preferred. The dye may be chosen, for example, from indoaniline dyes, oxonol dyes, porphyrin derivatives, anthraquinone dyes, merostyryl dyes, pyrylium compounds, and sqarylium derivatives. Absorbing dyes are disclosed in numerous publications, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618. Examples of useful absorbing dyes include, ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors), and Trump IR Dye (Eastman Kodak, Rochester, N.Y.).

The photothermal conversion materials, as well as any other colorants present in the imageable elements, should be removable from the loaded developer by the process of the invention. The material may be precipitated when the pH of the developer is reduced and removed during the solid/liquid separation step. Or it may be dispersed, rather than dissolved, in the developer and removed during the solid/liquid separation step. Or in may adhere to a precipitate formed when the pH of the loaded developer is reduced and removed during the solid/liquid separation step. That is, the precipitate may act as a flocculent for the colorant. Formation of an essentially colorless liquid during the solid/liquid separation step indicates that the colorant has been removed by the method of the invention.

The amount of photothermal conversion material in the element is generally sufficient to provide an optical density of at least 0.05, and preferably, an optical density of from about 0.5 to about 2 at the imaging wavelength. As is well known to those skilled in the art, the amount of absorber required to produce a particular optical density can be determined from the thickness of the layer and the extinction coefficient of the absorber at the wavelength used for imaging using Beers law. Typically the underlayer comprises at least about 0.1 wt % of imaging radiation absorber, and preferably from about 1 to about 30 wt % of absorber.

When a separate absorber layer is present, the underlayer and the imageable layer are preferably substantially free of photothermal conversion material and the absorber layer preferably has a thickness sufficient to absorb at least 90%, preferably at least 99%, of the imaging radiation. Typically, the absorber layer has a coating weight of about 0.02 $g/m^2$ to about 2 $g/m^2$, preferably about 0.05 $g/m^2$ to about 1.5 $g/m^2$ When a photothermal conversion material is present in the imageable layer, it may comprise infrared absorber or dye bound to a phenolic material (i.e., a phenolic material derivatized with an infrared absorber or infrared absorbing dye). If an appropriate infrared absorber or dye is selected, the derivatized polymeric material can act as the polymeric material, the solubility-suppressing component, and/or the photothermal conversion material.

The imageable layer and/or the underlayer may comprise particulate material to improve both the scratch resistance and presslife of the exposed and developed element. Typically, the particles have an average diameter about 0.5 µm and about 10 µm. The amounts of particles used can range from about 0.5% to about 30% of the coating weight of the layer, preferably is about 5% to about 15%.

The imageable element may comprise a negative-working, alkaline developable printing plate, typically one containing a novolac resin and/or another phenolic resin, is imagewise exposed with a suitable light source and heated to harden the exposed regions. These materials are described, for example, in Haley, U.S. Pat. No. 5,372,907; Haley, U.S. Pat. No. 5,466,557; and Nguyen, U.S. Pat. No. 5,919,601.

Haley '907 discloses a radiation-sensitive composition that is sensitive to both ultraviolet and infrared radiation. The composition comprises (1) a resole resin, (2) a novolac resin, (3) a latent Brönsted acid and (4) an infrared absorber. The solubility of the composition in an alkaline developer is both reduced in exposed regions and increased in unexposed regions by the steps of imagewise exposure to imaging radiation and heating.

Nguyen discloses radiation-sensitive compositions imageable by infrared and ultraviolet/visible radiation. These compositions comprise a thermal-activated acid generator; a crosslinking resin; a binder resin comprising a polymer containing reactive pendant groups selected from hydroxy, carboxylic acid, sulfonamide, and alkoxymethylamides; an infrared absorber; and optionally an ultraviolet/visible radiation-activated acid generator for ultraviolet/visible sensitization. The thermal-activated acid generators are typically latent Brönsted acids.

Latent Brönsted acids described in both inventions are precursors that form a Brönsted acid by thermally or photochemically initiated decomposition. Latent Brönsted acids include, for example, onium salts in which the onium cation is iodonium, sulphonium, diazonium, phosphonium, oxysulphoxonium, oxysulphonium, sulphoxonium, selenonium, arsonium, or ammonium, and the anion is a non-nucleophilic anion selected from tetrafluoroborate, hexafluorophosphate, hexafluoroantimonate, triflate, tetrakis (pentafluorophenyl)borate, pentafluoroethyl sulfonate, p-methyl-benzyl sulfonate, ethyl sulfonate, trifluoromethyl acetate, and pentafluoroethyl acetate. Non-ionic latent Brönsted acids include, for example, haloalkyl-substituted s-triazines, which are described, for example, in Smith, U.S. Pat. No. 3,779,778.

The thermally imageable element may be prepared by methods well known in the art. The layers may be applied by, for example, such as coating, lamination, or extrusion. The underlayer, if present, is applied over the hydrophilic surface of the hydrophilic substrate. The absorber layer, if present, is applied over the underlayer or over the hydrophilic surface of the hydrophilic substrate if the underlayer is not present. The imageable layer is then applied over either the hydrophilic surface of the hydrophilic substrate, or over the absorber layer if an absorber layer is present, or over the underlayer if an underlayer is present and an absorber layer is not present. It is important to avoid intermixing of the layers during this process. If a second layer is coated over a first layer from a solvent or a mixture of solvents, care should be taken so that the solvent or mixture of solvents used to coat the second layer does not dissolve the first layer and cause mixing of the layers. If the photothermal conversion material is a sublimable dye, the absorber layer may be deposited by sublimation of the photothermal conversion material onto the underlayer, if present, or the hydrophilic surface of the hydrophilic substrate if the underlayer is not present.

The advantageous properties of this invention can be observed by reference to the following examples, which illustrate but do not limit the invention.

EXAMPLES

| Glossary | |
|---|---|
| meso-Inosit | cis-1,2,3,5-trans-4,6-hexahydroxycyclohexane (Aldrich, Milwaukee, WI, USA) |
| REWORYL ® NXS 40/Na | Sodium xylenesulfonate (Rewo, Steinau, Germany) |
| REWOTERIC ® AM-V | Sodium capryloamphoacetate wetting agent (Witco, Perth Amboy, NJ, USA) |
| Sorbidex 240 | Sorbitol (75 wt % aqueous solution) (Cerestar, Sas van Gent, Netherlands) |
| SYNPERONIC ® T 304 | Poloxamine 304; Polyoxyethylene, polyoxypropylene liquid block copolymer of ethylene diamine (I.C.I., Wilmington, DE, USA) |
| TRILON ® B chelating agent | Tetra sodium ethylenediamine tetraacetic acid (BASF, Ludwigshafen, Germany) |

Preparation of Developers and Replenishers

The following developers and repelenishers were prepared by stirring the components together:

Developer 1: Water (71.0 kg); Sorbidex 240 (20.0 kg); SYNPERONIC® T 304 (0.17 kg); 45 wt % potassium hydroxide solution (6.5 kg); and REWORYL® NXS 40/Na (2.3 kg).

Developer 2: Water (81.7 kg); meso-inosit (15.0 kg); 45 wt % potassium hydroxide solution (2.9 kg); REWOTERIC® AM-V (0.2 kg); and TRILON® B chelating agent (0.2 kg).

Replenisher 1: Water (67.6 kg); Sorbidex 240 (20.0 kg); SYNPERONIC® T 304 (0.17 kg); 45 wt % potassium hydroxide solution (9.9 kg); and REWORYL® NXS 40/Na (2.3 kg).

Replenisher 2: Water (81.0 kg); meso-inosit (15.0 kg); 45 wt % potassium hydroxide solution (3.6 kg); REWOTERIC® AM-V (0.2 kg); and TRILON® B chelating agent (0.2 kg).

Processing of Positive-Working Thermal Plates

Easyprint™, Virage™, Capricorn™ Gold, and Electra Excel™ positive-working printing plate precursors are all available from Kodak Polychrome Graphics LLC.

The plate precursors were cut to a size of 790×850 mm. The printing plate precursors were exposed as follows: the Easyprint™ precursors with 510 mJ/cm$^2$ of ultraviolet radiation, and the Virage™ and Capricorn™ Gold precursors with 525 mJ/cm$^2$ of ultraviolet radiation. A metal halide MH Burner of Sack was used for exposure. The Electra Excel™ precursors were exposed in a Trendsetter 3244 (Creo) infrared exposure unit (CREO, British Columbia, Canada) at an energy of 10 W and a drum rotational speed of 180 rpm.

A Mercury 850 (Kodak Polychrome Graphics LLC) processor, equipped with an immersion type developing bath, a section for rinsing with water, and a gumming and drying section, was used to develop the exposed plates. The processor was filled with 60 L of developer. If the processor contains more that 60 L of developer, the excess is removed via an overflow. Separately, a container for the appropriate replenisher was attached from which the replenisher was added to the developing bath via a pump.

To keep the activity of the developer bath substantially constant, 40 mL of replenisher was added to the developer bath per 1 $m^2$ of printing plate precursor processed. The following parameters were kept constant in all tests: temperature of the developing bath: $(23\pm1)°$ C.; and dwell time in the developer: 25 sec.

Example 1

Five loaded developers were prepared as indicated in Table 1.

TABLE 1

| Developer No. | Precursor | Coating weight (g/m$^2$) | Developer and Replenisher Used | Loading (m$^2$/L) |
|---|---|---|---|---|
| 1 | Easyprint | 1.85 | 1 | 14 |
| 2 | Easyprint | 1.90 | 2 | 12 |
| 3 | Virage | 2.30 | 2 | 10 |
| 4 | Easyprint | 2.05 | 1 | 12 |
| 5 | Electra Excel | 1.50 | 1 | 20 |

Concentrated hydrochloric acid was added dropwise at room temperature with stirring to 5 L of each of the loaded developers until the pH was about 10.5. After an additional 0.25 hr of stirring, the precipitate that formed was removed by either filtration or centrifugation. In each case, the processed developer was obtained as a clear, colorless solution.

The precipitate from each loaded developer was dried for about 24 hr in a forced air oven at about 45° C. and weighed. The solid content of each of the processed developers and the solid content of each of the corresponding fresh developers was determined with a LJ16 Mettler moisture analyzer. The results are shown in Table 2.

TABLE 2

| Developer No. | Weight of Precipitate (g/5 L) | Coating Weight Removed (g/5 L) | Solid Content of Processed Developer (wt %) | Solid Content of Fresh Developer (wt %) |
|---|---|---|---|---|
| 1 | 127 | 129.5 | 19.9 | 18.0 |
| 2 | 112 | 114 | 21.1 | 18.2 |
| 3 | 113 | 115 | 19.4 | 18.2 |
| 4 | 120.5 | 123 | 19.8 | 18.0 |
| 5 | 148 | 150 | 22.8 | 18.0 |

In each case, the isolated precipitate closely corresponds to the weight of the imageable layer removed during the development process, indicating that essentially all of the solids derived from the imageable layer ("loaded solids") have been removed. The increase in solids content of in the processed developer is due to the formation of potassium chloride during the partial neutralization of the loaded developer.

Example 2

The example illustrates preparation of a refreshed developer. Potassium hydroxide (0.3 g) was dissolved in 10 kg of processed developer #1 produced in Example 1. 10 mL of the refreshed developer was diluted with 90 mL of deionized water and titrated with 0.5 N HCl using a Titrino DMS 716 (Metrohm). The alkali value (number of mL of acid to reach the first equivalence point) was 11.3 mL, which was identical with the value for developer 1.

Example 3

The example illustrates preparation and use of a refreshed developer. The results show that refreshed developer can be used to develop printing plates based on novolac resins.

Easyprint™ positive-working printing plate precursors (Kodak Polychrome Graphics LLC) were cut to a size of 790×850 mm and exposed with 510 mJ/cm$^2$ of radiation from a metal halide lamp (MH-Bruner, available from Sack) through a Foga square root of two test strip with an optical density range of 0.15 to 1.95.

The exposed printing plate precursors were developed in a Mercury processor as described above. During the test period, the exposed printing plate precursors were developed one after another at a rate of 140 plates per day for 25 days with 4 weekend interruptions. The activity of the refreshed developer was monitored by titration with 0.5 N HCl as described above. Throughout the run, 175 L of overflow of used developer was collected, which corresponds to 50 mL/m$^2$ of developed plate.

During the test period, the development process was not affected by either the formation of foam or the precipitation of insoluble materials on the bottom of the processor. After testing was complete, the processor could be easily cleaned by rinsing with water and no residue remained in the processor.

To evaluate the printing plates, the following criteria were evaluated: steps of the gray wedge that are not covered ("gray scale") and the microlines that have not been attacked. The results are given in Table 3.

TABLE 3

Stability and Load Test Using Refreshed Developer

| Throughput (m$^2$/L) | Microlines | Gray Scales | Replenisher (mL/m$^2$) | Titration (mL 0.5 N HCl) |
|---|---|---|---|---|
| 0 | 12 | 3 | — | 11.3 |
| 8 | 12/15 | 3/4 | 80 | 11.2 |
| 16 | 12 | 3/4 | 80 | 11.0 |
| 20 | 12/15 | 3 | 80 | 11.5 |
| 24 | 12 | 3 | 80 | 11.3 |
| 28 | 12 | 3 | 80 | 11.6 |
| 32 | 12/15 | 3/4 | 80 | 11.4 |
| 36 | 12 | 3 | 80 | 11.3 |
| 40 | 12/15 | 3/4 | 80 | 11.3 |
| 44 | 12 | 3 | 80 | 11.5 |
| 48 | 12/15 | 3 | 80 | 11.4 |
| 52 | 12/15 | 3/4 | 80 | 11.5 |
| 58.3 | 12/15 | 3/4 | 80 | 11.5 |

Printing plates formed after throughputs of 20, 40, and 58.3 m$^2$/L were evaluated for ink acceptance and toning. Each of the exposed and developed printing plates was mounted in a sheet-fed offset press and proofed. All of the images accepted ink without any problems and the paper copies did not show any background (toning) in the non-image areas. After about 2,000 copies had been printed, the press was stopped for about 45 min and restarted (restart test). The same results were obtained as were obtained at the beginning of the print run. In all cases, the non-image areas did not show any toning, which indicates good protection of the hydrophilic substrate by the developer.

Having described the invention, we now claim the following and their equivalents.

What is claimed is:

1. A method for refreshing a developer, the method comprising the steps of:
   (a) developing an imaged printing plate precursor with an aqueous, essentially silicate-free developer having a pH greater than about 12, and producing a loaded developer comprising loaded solids,
   in which:
      the printing plate precursor comprises an imageable layer over a hydrophilic substrate,
      the imageable layer comprises a polymeric material,
      the polymeric material is either (i) dispersible in an aqueous solution that has a pH of about 12.0 to about 14.0 or (ii) soluble in an aqueous solution that has a pH of about 12.0 to about 14.0 and insoluble in an aqueous solution that has a pH below about 11.0,
      the loaded solids comprise the polymeric material, and
      the loaded developer has a pH of about 12.0 to about 14.0 and a loaded solids content of about 0.1 wt % to about 10 wt %;
   (b) lowering the pH of the loaded developer to below about 11.0 and producing a liquid whose pH is below about 11.0;
   (c) separating insoluble material from the liquid produced in step (b) and producing an essentially colorless liquid, in which the insoluble material comprises material dispersed in the developer, a precipitate formed in step (b), or a combination thereof; and
   (d) raising the pH of the essentially colorless liquid to about 12.0 to about 14.0 and producing a refreshed developer.

2. The method of claim 1 in which the pH of the aqueous, essentially silicate-free developer is about 12.5 to about 13.7.

3. The method of claim 1 additionally comprising, after step (d), the step of developing imaged printing plate precursors with the refreshed developer.

4. The method of claim 1 in which the insoluble material comprises a precipitate produced in step (b).

5. The method of claim 4 in which the polymeric material is selected from the group consisting of phenolic polymers, carboxylic acid polymers, sulfonamide polymers, and mixtures thereof.

6. The method of claim 5 in which the printing plate precursor is a one-layer element.

7. The method of claim 6 in which the imageable layer comprises a compound that comprises an o-diazonaphthoquinone moiety.

8. The method of claim 1 in which the printing plate precursor comprises a photothermal conversion material.

9. The method of claim 8 in which the insoluble material comprises a precipitate produced in step (b).

10. The method of claim 9 in which the polymeric material is selected from the group consisting of phenolic polymers, carboxylic acid polymers, sulfonamide polymers, and mixtures thereof.

11. The method of claim 10 in which the printing plate precursor comprises at least one layer between the imageable layer and the hydrophilic substrate.

12. The method of claim 11 in which the at least one layer comprises the photothermal conversion material.

13. The method of claim 12 in which the imageable layer comprises a dissolution inhibitor.

14. The method of claim 8 additionally comprising, after step (d), the step of developing imaged printing plate precursors with the refreshed developer.

15. The method of claim 14 in which:
   the polymeric material is a phenolic polymer;
   the printing plate precursor comprises at least one layer between the imageable layer and the hydrophilic substrate; and
   the at least one layer comprises the photothermal conversion material.

16. The method of claim 1 in which hydrochloric acid is added to the developer in step (a).

17. The method of claim 1 in which the loaded solids content is about 4 wt % to about 6 wt %.

18. The method of claim 17 in which the pH of the aqueous, essentially silicate-free developer is about 12.5 to about 13.7.

19. The method of claim 18 additionally comprising, after step (d), the step of developing imaged printing plate precursors with the refreshed developer.

* * * * *